United States Patent [19]

Langer et al.

[11] Patent Number: 4,754,312

[45] Date of Patent: Jun. 28, 1988

[54] INTEGRATABLE DIFFERENTIAL LIGHT DETECTOR

[75] Inventors: Dietrich W. Langer, Yellow Springs; Andris Ezis, Fairborn, both of Ohio

[73] Assignee: The United States of America as represented by the Secretary of the Air Force, Washington, D.C.

[21] Appl. No.: 35,332

[22] Filed: Apr. 7, 1987

[51] Int. Cl.$^4$ .................... H01L 27/14; H01L 29/12; H01L 27/02

[52] U.S. Cl. ........................... 357/30; 357/58; 357/46; 250/370; 350/96.11; 307/355

[58] Field of Search ............... 357/30 B, 30 P, 30 G, 357/58, 46; 307/355, 356, 357; 250/370, 578; 350/96.11, 96.12, 96.15, 96.17

[56] References Cited

U.S. PATENT DOCUMENTS

| | | | |
|---|---|---|---|
| 3,531,645 | 9/1970 | deJong | 250/210 |
| 4,179,702 | 12/1979 | Lamorte | 357/30 |
| 4,366,377 | 12/1982 | Notthoff et al. | 357/58 |
| 4,447,746 | 5/1984 | Fang et al. | 307/311 |
| 4,533,783 | 8/1985 | Benjamin et al. | 136/249 |
| 4,582,952 | 4/1986 | McNeely et al. | 136/249 |
| 4,591,892 | 5/1986 | Yamazaki | 357/58 |
| 4,600,935 | 7/1986 | Dresner | 357/58 |

Primary Examiner—Martin H. Edlow
Assistant Examiner—Donald J. Featherstone
Attorney, Agent, or Firm—Bernard E. Franz; Donald J. Singer

[57] ABSTRACT

This invention is directed to a three-terminal semiconductor device which acts as a differential light detector. It is based on the operation of two reverse biased PIN photodetectors where one receives light through its P-doped surface and the other through its N-doped surface. The device is configured to be compatible with applications in integrated optics and with fiber optics. In principle of operation the invention relies on the production and collection of electrons from the detection of a first light intensity and the production and collection of holes from the detection of the intensity of a second light. This is done in a connected or integrated semiconductor which allows the recombination of electrons and holes. The excess number of electrons or holes, depending upon which light is received with the greatest intensity, is extracted from the recombination region and is the basis for the output signal.

4 Claims, 2 Drawing Sheets

INTEGRATABLE DIFFERENTIAL LIGHT DETECTOR

RIGHTS OF THE GOVERNMENT

The invention described herein may be manufactured and used by or for the Government of the United States for all governmenal purposes without the payment of any royalty.

BACKGROUND OF THE INVENTION

The present invention relates generally to a semiconductor device which acts as a differential light detector.

Fiber obtical sensors, where the light intensity (or polarization which can be converted into an intensity change) is changed by the environment of the fibers (e.g., pressure, curvature, temperature) are usually operated with a reference beam from the same source in order to compensate for fluctuations or degradation of the input light. The proposed device facilitates this comparison. Novel optical A/D converters and other applications of integrated optical signal processing makes use of Mach-Zehner interferometers which decrease the light transmitted according to an impressed electronic signal. The transmitted light intensity is subsequently compared with a reference intensity which bypassed the interferometer. The proposed device is ideally suited to make this comparison more accurately and at higher speeds than presently used methods.

U.S. patents of interest include U.S. Pat. No. 3,531,645 to Marie DeJong, which shows in FIG. 2 a pair of photoresistors connected in a bridge circuit so as to give a differential output. The bridge circuit is described in the patent as useful for comparing two light intensities. U.S. Pat. No. 4,179,702 to Lamorte is directed to a monolithic cascade solar cell used in converting incident light radiation into electrical energy. This patent shows in FIG. 4 a three-terminal device with a voltage opposing configuration. A circuit with two PIN photodiodes is shown in Fang et al U.S. Pat. No. 4,447,746. In Benjamin et al U.S. Pat. No. 4,533,783 a solar cell provices alternating current. Light-generated hole-electron pairs alternately diffuse in opposite directions across alternately induced PIN junctions. U.S. Pat. No. 4,600,935 to Dresner discloses back-to-back diodes and U.S. Pat. No, 4,582,952 to McNeely is concerned with a gallium arsenide type solar cell.

SUMMARY OF THE INVENTION

An objective of the invention is to simplify the comparison of two light intensities and intrinsically to provide for a higher degree of accuracy of such commparison. A further objective is to provide miniaturized devices, as part of integrated electronic or optical circuits or as discrete devices, to improve and simplify the operation of optical sensors which compare an optical reference intensity with an event conditioned optical signal intensity, as used in a variety of optical sensors, and also in optical A/D converters. The proposed device can compare steady state signals and simultaneous or overlapping pulses at high frequencies exceeding the limits of conventional detector/electronic comparator assemblies.

This invention is directed to a three-terminal semiconductor device which acts as a differential light detector. It is based on the operation of two reverse biased PIN photodetectors where one receives light through its P-doped surface and the other through its N-doped surface. The device is configured to be compatible with applications in integrated optics and with fiber optics. In principle of operation the invention relies on the production and collection of electrons from the detection of a first light intensity and the production and collection of holes from the detection of the intensity of a second light. This is done in a connected or integrated semiconductor which allows the recombination of electrons and holes. The excess number of electrons or holes, depending upon which light is received with the greatest intensity, is extracted from the recombination region and is the basis for the output signal.

The device can provide a direct measure of the difference of two light intensities. Two incoherent light signals are usually compared by using the electronic output of two detectors and comparing their magnitude in a circuit configuration. The circuit is tasked with supplying the difference of two sizable signals of similar magnitude if the equality or near equality of light input signals is to be established. The proposed device, consisting of two integrated semiconductor detectors, accomplishes the same task with higher accuracy, higher speed and less noise while eliminating the need for an electronic comparator circuit.

DETAILED DESCRIPTION

A three-terminal semiconductor device is proposed which can transform the magnitude of the difference of two input light intensities into a corresponding electrical output signal. It is configurable to be compatible with applications in integrated optics and with fiber optics. The principle relies on the production and collection of electrons from the detection of light intensity 1 and the production and collection of holes from the detection of light intensity 2 in a connected or integrated semiconductor which allows the recombination of electrons and holes. The excess number of electrons (or holes), if intensity 1 is larger than intensity 2 (or vice versa), is extraced from the recombination region and is the basis for the output signal. The efficiencies of the detectors 1 and 2 for the transformation of light intensities into electrons and holes, respectively, can be adjusted by geometrical factors and/or supply voltages to deliver known numbers of electrons and holes per incident photon, respectively. Thus a ""difference signal"" can be obtained corresponding to the value by which light intensity 1 exceeds, for example, a preset value of light intensity 2. In particular, detector efficiencies and recombination and signal extractor geometries can be adjusted such that no output signal is obtained if both light intensities are equal; the decrease of one input intensity then will cause a corresponding output signal. The device thus acts as an integrated optical comparator.

Figure 1:
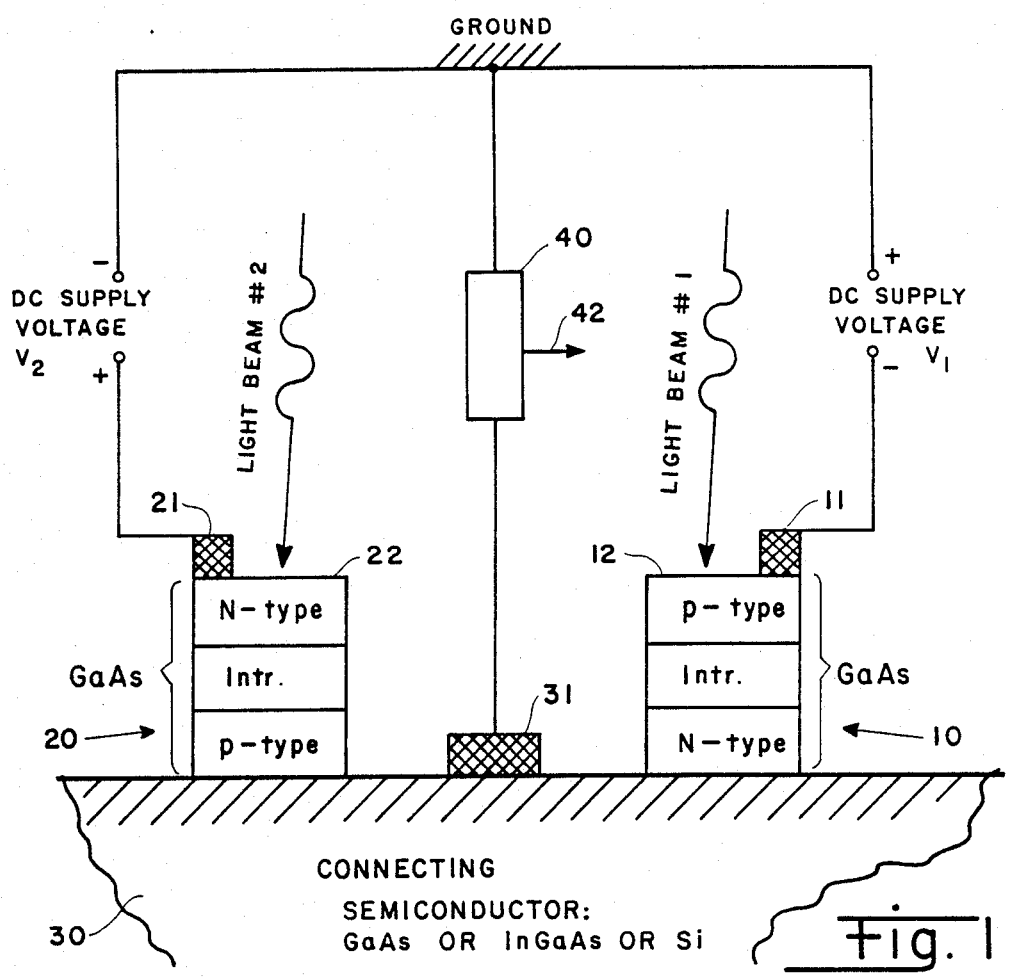
FIG. 1 is a diagram showing the structure of a device according to the invention.

Referring to FIG. 1 , a specific embodiment of the invention is based on the operation of two reverse biased GaAs PIN photodetectors 10 and 20, where one detector 10 receives the light through its P-doped surface 12 and the other detector 20 through its N-doped"

surface 22. The reverse sides of these detectors are connected by an intrinsic or near intrinsic semiconductor 30 of the same chemical composition or of one with energetically lower conduction band and higher valence band edges than that of the connected N and P parts of the PIN diodes. In the simplest embodiment, ohmic contacts 11 and 21 are made to the light facing sections of the PIN diodes 10 and 20 respectively, with an additional ohmic contact 31 to the intrinsic part which connects both diodes. The latter contact 31 is connected via a current sensor 40 to ground. A negative voltage with respect to ground is applied to the P contact 11 of the first diode 10 and a positive voltage to the N contact 21 of the second diode 20. The output signal on line 42 is the magnitude and direction of the current flowing through the sensor 40 to ground.

The difficulty of providing an ohmic contact to intrinsic materal can be avoided if one wants to fabricate a device in which by design the charge carrier flow caused by the reference beam is not to be exceeded, i.e., signal current flow is in one direction only and zero for equal light intensities. Then, the formerly called intrinsic connecting semiconductor 30 may be substituted by a doped semiconductor of the identical composition or by one of lower conduction and higher valence band edges. The doping is N-type if the reference beam enters the P-doped section of the photodiode, or P-type if the reference beam enters the N-doped section of the photodiode. Also junction photodiodes or avalanche diodes may be substituted for the PIN diodes.

FIG. 1 illustrates this principle with light beam 1 as reference. In operation, light absorbed in one of the conventionally imensioned and fabricated PIN diodes creates electron and hole pairs which will be separated by the applied field allowing a flow of electrons in magnitude corresponding to the absorbed photon flux into the connecting semiconductor region. Likewise the other diode supplies a flow of holes the magnitude of which corresponds to the photon flux absorbed in the second diode. Electrons and holes recombine in the connecting semiconductor section and only the excess of electrons will complete the circuit and flow to ground. The efficiencies of the PIN and NIP diodes, i.e., number of electrons or holes respectively supplied to the connecting semiconductor per incident photon can be adjusted by doping, geometry and supply voltages of the diodes such that they are equal which results in a current flow through the current sensor 40 (which may be simply a resistor) when incident light intensities differ.

Figure 2A:
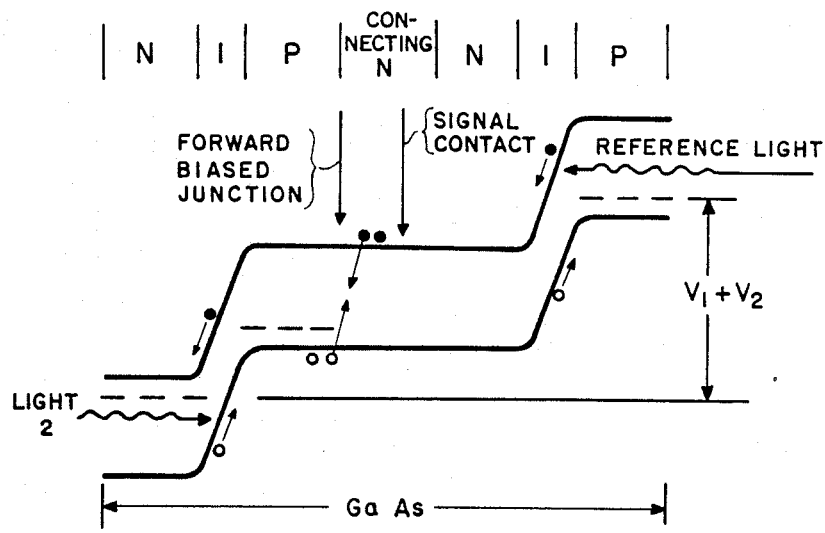
FIGS. 2a and 2b are graphs illustrating the operation.
Figure 2B:
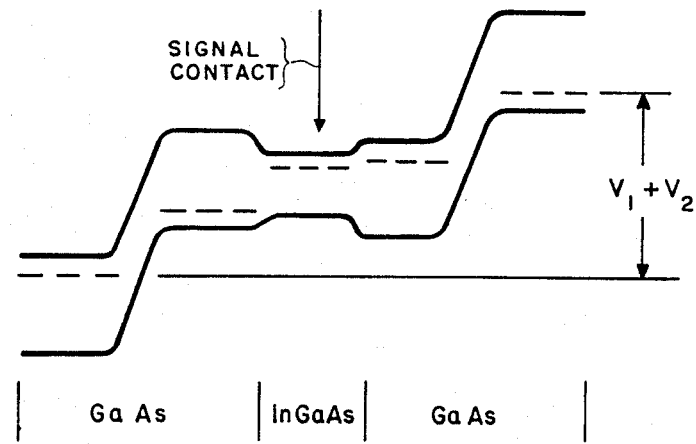

FIG. 2a shows an energy diagram of the device with applied bias and with a connecting N-type semiconductor of the same material as the PIN diodes. The magnitude of the field at the forward biased junction is critical for the operation because an extremely high field would allow, for example, a hole current flow through diode 1 and lead to breakdown, while too low a field would prevent the electron-hole recombination. The range of field under which the device operates can be extended by making the junction less abrupt or by substituting a material with an appropriately smaller bandgap; e.g., InGaAs if diodes ar GaAs (FIG. 2b). The proposed device can be fabricated, for example, by spatially separated growth of a PIN diode and a NIP diode on an intrinsic semiconductor (FIG. 1), which would be convenient for the coupling of optical fibers to the diodes. Alternate fabrication methods are equivalent.

Figure 3:
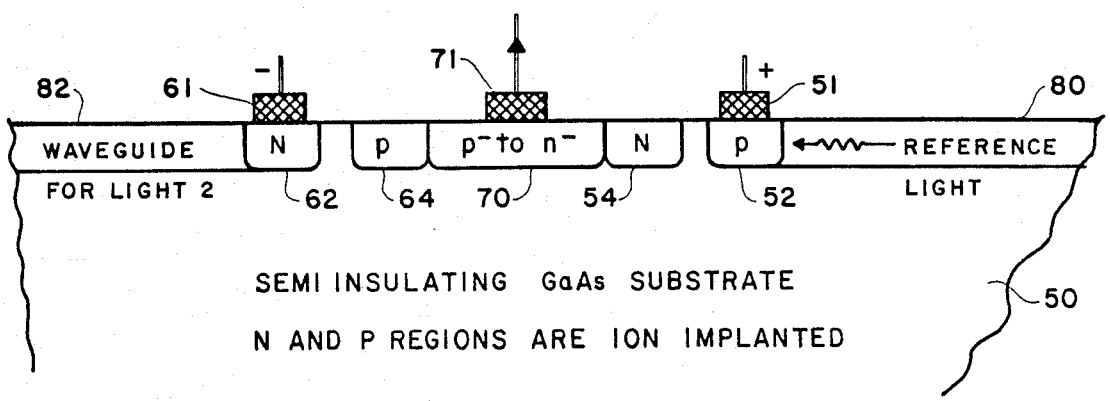
FIG. 3 shows the structure of an alternative embodiment.

A different configuration, most suitable for coupling to surface or subsurface waveguides is shown in FIG. 3. Here the diode junctions are formed by ion implantation. The grading of the connecting semiconductor can also be conveniently achieved in this fabrication process. The substrate 50 may be semi-insulating GaAs. One diode comprises a P region 52 and an N region 54, formed by ion implantation separated by an intrinsic region of the substrate 50, with an ohmic ontact 51 formed on the P-doped region 52; while the other diode comprises an N region 62 and a P region 64, formed by ion implantation separated by an intrinsic region of the substrate 50, with an ohmic ontact 61 formed on the N-doped region 62. The connecting semiconductor region 70 is formed by ion doping graded from a p⁻ zone adjacent to the P region 64 to a n⁻ zone adjacent to the N region 54. An ohmic contact 71 is formed at the center of region 70, for connection to a current sensor. The P region 52 of the first diode is coupled to a waveguide 80, which may be used for a reference light beam; and the N region 62 of the other diode is coupled to a waveguide 82, for another light beam.

It is understood that cetain modifications to the invention as described may be made, as might occur to one with skill in the field of the invention, within the scope of the appended claims. Therefore, all embodiments contemplated hereunder which achieve the objects of the present invention have not been shown in complete detail. Other embodiments may be developed without departing from the scope of the appended claims.

What is claimed is:

1. A three-terminal semiconductor device which can transform the magnitude of the difference of intensities of two input light beams into a corresponding electrical output signal, comprising first and second photo diodes having a common semiconductor substrate, wherein each of said diodes includes at least an N-doped region and a P-doped region, the first diode having a first ohmic contact formed on a surface of its P-doped region, the second diode having a second ohmic contact formed on a surface of its N-doped region, a connecting intrinsic or near intrinsic region between a surface of the N-doped region of the first diode and a surface of the P-doped region of the second diode, and a third ohmic contact formed to the connecting region;

said ohmic contacts being connected to respective terminals for connecting the device to a direct-current power supply having negative, positive and intermediate potential terminals, with the first contact connected to the negative terminal, the second contact to the positive terminal, and the third contact via current sensing means to the intermediate potential terminal;

the device being operative with the two light beams directed respectively to the first and second photo diodes resulting in the production and collection of electrons from the detection of an intensity of one light beam and the production and collection of holes from the detection of the intensity of the other light beam, with the connected or integrated semiconductor allowing the recombination of electrons and holes, the excess number of electrons or holes, depending upon which light beam is received with the greatest intensity, being extracted from the recombination region and detected by the current sensing means to produce an output signal indicative of the difference of intensity of the two light beams.

2. A semiconductor device according to claim 1, wherein the first and second ohmic contacts are formed on surfaces of light facing sections of the diodes.

3. A semiconductor device according to claim 2, wherein the first and second diodes are a PIN diode and NIP diode formed by spatially separated growth on an intrinsic semiconductor.

4. A semiconductor device according to claim 1, wherein the first and second diodes are formed by ion implantation in said common semiconductor substrate.

* * * * *